United States Patent
Etoh et al.

(10) Patent No.: US 8,147,712 B2
(45) Date of Patent: Apr. 3, 2012

(54) POLISHING COMPOSITION

(75) Inventors: Akinori Etoh, Ichihara (JP); Setsuko Oike, Sodegaura (JP); Shigeharu Fujii, Nishiwaki (JP); Kiyotaka Shindo, Otake (JP); Tomokazu Ishizuka, Ichihara (JP)

(73) Assignee: Mitsui Chemicals, Inc., Tokyo (JP)

( * ) Notice: Subject to any disclaimer, the term of this patent is extended or adjusted under 35 U.S.C. 154(b) by 834 days.

(21) Appl. No.: 12/225,374

(22) PCT Filed: Mar. 19, 2007

(86) PCT No.: PCT/JP2007/000249
§ 371 (c)(1),
(2), (4) Date: Sep. 19, 2008

(87) PCT Pub. No.: WO2007/108215
PCT Pub. Date: Sep. 27, 2007

(65) Prior Publication Data
US 2010/0155654 A1    Jun. 24, 2010

(30) Foreign Application Priority Data
Mar. 20, 2006   (JP) ................. 2006-076071

(51) Int. Cl.
*C09K 13/00*   (2006.01)

(52) U.S. Cl. .......... 252/79.1; 438/692; 438/693
(58) Field of Classification Search .......... 252/79.1, 252/79.2, 79.3, 79.4
See application file for complete search history.

(56) References Cited

U.S. PATENT DOCUMENTS

| 6,568,997 B2 * | 5/2003 | Costas et al. ................. 451/41 |
| 6,786,944 B2 * | 9/2004 | Hattori et al. ................ 51/307 |
| 2005/0136671 A1 | 6/2005 | Goldberg et al. |
| 2006/0289826 A1 | 12/2006 | Koyama et al. |

FOREIGN PATENT DOCUMENTS

| JP | 2001-55559 | 2/2001 |
| JP | 3172008 | 3/2001 |
| JP | 2005-191544 | 7/2005 |
| JP | 2005-217396 | 8/2005 |
| JP | 2005-353681 | 12/2005 |
| JP | 2006-93170 | 4/2006 |
| WO | WO 01/17006 A1 | 3/2001 |
| WO | WO 2004/107429 A1 | 12/2004 |

* cited by examiner

*Primary Examiner* — Roberts Culbert
(74) *Attorney, Agent, or Firm* — Foley & Lardner LLP

(57) ABSTRACT

Disclosed is a polishing composition containing not less than 1 wt % of a water-soluble resin, which is obtained by polymerizing a vinyl monomer containing an amino group and/or an amide group, based on the total weight of the polishing composition.

11 Claims, No Drawings

POLISHING COMPOSITION

TECHNICAL FIELD

The present invention relates to a polishing composition which is capable of polishing and smoothing a surface of a metal for forming copper wiring or the like without any damages in a wiring process, which is one of processes for the manufacture of semiconductor devices.

BACKGROUND ART

In late years, in a wiring process for the manufacture of semiconductor devices, there has been employed CMP (Chemical and Mechanical Polishing) as a technique for forming a groove for forming wiring on an insulation layer, embedding a metal for wiring in the groove by the plating method or the like, removing an excess metal and smoothing the insulation layer including metal wiring.

This is a method including chemically and mechanically polishing a surface of a substance to be polished by a slurry with abrasive particles dispersed therein.

In the CMP technique, there has been used a slurry containing an inorganic abrasive particles such as ceria, alumina, or silica or the like from the past. However, these abrasive particles have high hardness. When a metal layer having low hardness such as copper or the like is polished, there are large problems such as abrasive damages to the surface of a metal to be polished which are called scratches, concave portions formed by excessively polishing the central portion of wiring part of a metal to be polished which are called dishing, and concave portions greater than dishing formed by excessively polishing the central portion of a dense area of wiring pattern including an insulation layer, i.e., an under coat layer which are called erosion.

At present, in order to improve performance of semiconductor devices, the ½ width of wiring on the insulation layer becomes much finer from 130 nm to 90 nm and even to 65 nm, and wiring pattern that is an object to be polished in the wiring process is in a much complicated structure.

If the width of wiring becomes much finer, abrasive damages to the a metal surface to be polished due to scratches cause a breaking of wire, and dishing or erosion causes an increase or deviation in wiring resistance and a short circuit between wirings to be formed on the upper layer, thereby considerably deteriorating the reliability of semiconductor devices and drastically lowering the yield rate.

A scratch is caused by partial excessive polishing due to the hardness of abrasive particles or the existence of an aggregate of abrasive particles. A dishing is caused by excessive polishing due to hard abrasive particles, or addition of a pH regulating agent, an additive or the like, which is accelerated elution of a metal to be polished, used for the purpose of increasing the polishing rate. Erosion is caused by excessive polishing due to hard abrasive particles or a low polishing selectivity with a metal to be polished and an insulation layer or an under coat layer such as a barrier layer for preventing diffusion of a metal.

In order to solve these problems, there has been studied on the suppression of defects such as scratches or the like by reduction of mechanical load on a polished surface by decreasing polishing load. However, a high polishing rate may be difficult to be obtained and the throughput may be worsened.

Then, in order to achieve a high polishing rate even with low polishing load, there has been developed an electrochemical and mechanical polishing (ECMP) with suppressed mechanical polishing action by combining electropolishing and the conventional CMP process. ECMP is capable of obtaining a practical polishing rate even with small load of not more than 1 psi. However, there is a problem such that dishing is easy to proceed as compared to CMP since polishing proceeds by electrolysis of a metal to be polished.

Improvement of a slurry for suppressing the occurrence of defects has also been reviewed in various ways. Abrasive particles contained in the CMP slurry are generally inorganic materials such as alumina or the like, but there has been developed a polishing solution for changing abrasive particles from alumina to much softer silica and further polishing in a pH range of from neutral to alkaline in which elution of a metal to be polished is hardly caused. However, even when silica is used as abrasive particles, scratches are decreased as compared to the case where alumina is used as abrasive particles, but the occurrence of scratches, dishing or erosion cannot be fully suppressed.

Furthermore, in Japanese Patent No. 3172008 (Patent Document 1), there has been disclosed a method employing particles of an organic polymer compound having lower hardness than inorganic abrasive particles as polishing abrasive particles. However, since the organic polymer compound used herein employs resins does not have functional groups such as a methacryl resin, a polystyrene resin and the like, a chemical reaction with a metal to be polished never takes place, and a sufficient polishing rate is not obtained. Thus, such a method cannot be used in the actual process for the manufacture of semiconductor devices.

In order to solve the above problems, for example, in Japanese Patent Laid-open No. 2001-55559 (Patent Document 2), there has been disclosed an aqueous dispersion for CMP containing organic particles having functional groups capable of reacting with a metal to be polished. However, there has been no description on dishing or erosion.

Furthermore, in WO01/17006 (Patent Document 3), there have been disclosed a polishing agent for CMP containing a protective-film forming agent and a water-soluble polymer. The water-soluble polymer used herein is polyacrylic acid, polyacrylamide or the like, but the water-soluble polymer is used for the purpose of suppressing etching. When its combination amount exceeds 0.3 weigh part, a polishing rate is lowered.

Patent Document 1: Japanese Patent No. 3172008
Patent Document 2: Japanese Patent Laid-open No. 2001-55559
Patent Document 3: WO 2001/17006

DISCLOSURE OF THE INVENTION

An object of the present invention is to provide a polishing composition used in CMP, electropolishing or ECMP, which exhibits a practical polishing rate and at the same time remarkably suppresses the occurrence of scratch, dishing or erosion.

In order to solve the above object, the present inventors have conducted an extensive study and as a result, the present invention has been completed. That is, the present invention includes the following inventions:

(1) a polishing composition containing a water-soluble resin obtained by polymerizing a vinyl monomer containing an amino group and/or an amide group, wherein said water-soluble resin is contained in an amount of not less than 1 wt %, based on the total weight of the polishing composition;

(2) the polishing composition as set forth in (1), wherein the vinyl monomer containing an amino group and/or an amide group is methacrylamide;

(3) the polishing composition as set forth in (2), wherein the water-soluble resin obtained by polymerizing a vinyl monomer containing an amino group and/or an amide group comprises a copolymer obtained by polymerizing 1 to 100 parts by weight of methacrylamide and 99 to 0 part by weight of one or more other vinyl monomers;

(4) the polishing composition as set forth in (3), wherein one or more the other vinyl monomers contain a vinyl monomer having at least one or more carboxyl groups;

(5) the polishing composition as set forth in any one of (1) to (4), wherein the pH is from 5 to 11;

(6) the polishing composition as set forth in (5), further containing organic particles and/or inorganic particles and water;

(7) the polishing composition as set forth in (5), further containing a water-soluble compound capable of forming a complex with a metal to be polished and water;

(8) the polishing composition as set forth in (7), wherein the water-soluble compound capable of forming a complex with a metal to be polished is at least one kind selected from carboxylic acids, amines, amino acids, ketones and nitrogen-containing compounds;

(9) the polishing composition as set forth in (8), wherein the water-soluble compound capable of forming a complex with a metal to be polished is an oxalic acid;

(10) the polishing composition as set forth in (5), further containing an anti-corrosive agent;

(11) the polishing composition as set forth in (10), wherein the anti-corrosive agent is a benzotriazole;

(12) the polishing composition as set forth in (5), further containing an oxidizing agent; and

(13) the polishing composition as set forth in (12), wherein the oxidizing agent is hydrogen peroxide.

The polishing composition of the present invention contains not less than 1 wt % of a water-soluble resin, which is obtained by polymerizing a vinyl monomer containing an amino group and/or an amide group, based on the total weight of the polishing composition. The polishing composition is capable of polishing an excess metal layer on an insulation layer formed wiring pattern in a process for manufacturing semiconductor devices at a practical polishing rate while suppressing the occurrence of scratch, dishing, erosion or the like.

BEST MODE FOR CARRYING OUT THE INVENTION

The present invention will be described in more detail below.

The present invention relates to a polishing composition containing a water-soluble resin, which is obtained by polymerizing a vinyl monomer containing an amino group and/or an amide group, wherein the water-soluble resin is contained in an amount of not less than 1 wt %, based on the total weight of the polishing composition. Furthermore, the polishing composition of the present invention may contain abrasive particles, a water-soluble compound capable of forming a complex with a metal to be polished, an oxidizing agent and water.

Hereinafter, respective components will be explained.
(Water-Soluble Resin)
The water-soluble resin used in the present invention contains a water-soluble resin which is obtained by polymerizing a vinyl monomer containing an amino group and/or an amide group.

The water-soluble resin can be produced according to a method such as a known aqueous polymerization or the like using the following monomers.

Examples of the vinyl monomer containing an amino group used in the present invention include dialkylaminoalkyl methacrylate, dialkylaminoalkyl acrylate, dihydroxyalkylaminoalkyl methacrylate, dihydroxyalkylaminoalkyl acrylate and the like. One or two or more kinds selected from these monomers can be used in combination.

Examples of the vinyl monomer containing an amide group used in the present invention include methacrylamide, acrylamide, N-alkylmethacrylamide, N-alkylacrylamide, N,N-dialkylmethacrylamide, N,N-dialkylacrylamide, N-methylolmethacrylamide, N-methylolacrylamide and the like. One or two or more kinds selected from these monomers can be used in combination.

Examples of the vinyl monomer containing both an amino group and an amide group used in the present invention include dialkylaminoalkyl acrylamide, dialkylaminoalkyl methacrylamide and the like. One or two or more kinds selected from these monomers can be used in combination. Incidentally, the monomers are not restricted thereto.

As the vinyl monomer containing an amino group and/or an amide group used in the present invention, a methacrylamide is preferably used because the occurrence of dishing or erosion in CMP or the like is suppressed and a practical polishing rate is exhibited.

The water-soluble resin in the present invention may be obtained by copolymerizing other one or more vinyl monomers in addition to the vinyl monomer containing an amino group and/or an amide group.

Examples of other vinyl monomers which may be copolymerized include methacrylate ester monomers, acrylate ester monomers, vinyl esters such as vinyl acetate, vinyl propionate and the like; vinyl monomers having a cyano group such as methacrylonitrile, acrylonitrile and the like; vinyl monomers containing halide such as vinyl chloride, vinylidene chloride and the like; and styrene monomers such as styrene, α-methylstyrene, vinyl toluene and the like.

Furthermore, as other vinyl monomers, a vinyl monomer having a functional group can be used. Examples of the vinyl monomer having a functional group include vinyl monomers having a carboxyl group such as methacrylic acid, acrylic acid and the like; vinyl monomers having an acetoacetoxy group such as acetoacetoxyethyl methacrylate, acetoacetoxyethyl acrylate and the like; vinyl monomers having a hydroxyl group such as 2-hydroxyethyl methacrylate, 2-hydroxyethyl acrylate, 2-hydroxypropyl methacrylate, 2-hydroxypropyl acrylate, 2-hydroxybutyl methacrylate, 2-hydroxybutyl acrylate, 4-hydroxybutyl methacrylate, 4-hydroxybutyl acrylate and the like; and vinyl monomers having a glycidyl group such as glycidyl methacrylate, glycidyl acrylate and the like.

An embodiment of at least one vinyl monomer having a carboxyl group contained in other vinyl monomer which may be copolymerized is particularly preferable from the viewpoint of the dispersion stability of the polishing composition.

Herein, preferable examples of the vinyl monomer having a carboxyl group include unsaturated monobasic acids such as acrylic acid, methacrylic acid, crotonic acid and the like; unsaturated dibasic acids such as itaconic acid, fumaric acid, maleic acid and the like; and one or two or more kinds selected from these monoesters in combination. In particular, acrylic acid and methacrylic acid are preferably used.

In the water-soluble resin of the present invention, a crosslinking monomer can be copolymerized, if necessary. Examples of the monomer containing two or more polymerizable unsaturated bonds in a molecule include divinyl benzene, butadiene, ethylene glycol dimethacrylate, ethylene glycol diacrylate, 1,3-butylene glycol dimethacrylate, methylenebisacrylamide and the like. The amount of the crosslinking monomer used is different depending on the kind of the crosslinking monomer in use, but it is usually not more than 20 wt %, and preferably not more than 10 wt %, based on the total amount of the vinyl monomer.

If necessary, a molecular weight regulator can be added to the water-soluble resin of the present invention. Examples of the molecular weight regulator include mercaptans such as t-dodecyl mercaptan, n-dodecyl mercaptan and the like; allyl compounds such as allyl sulfonic acid, methallyl sulfonic acid, salts thereof and the like; and alcohols of isopropanol.

Examples of the polymerization initiator used for polymerizing the water-soluble resin used in the present invention include water-soluble polymerization initiators such as persulfates, hydrogen peroxide, organic hydroperoxide, azobiscyanovaleric acid and the like; oil-soluble polymerization initiators such as azobisisobutyronitrile, benzoyl peroxide and the like; and redox polymerization initiators in combination with a reducing agent.

The amount of the polymerization initiator used is not particularly limited and may be in accordance with a known technique, but it is usually in the range of 0.1 to 10 parts by weight based on 100 parts by weight of the vinyl monomer. The amount is particularly in the range of 0.1 to 5 parts by weight. Furthermore, particularly preferably used is the polymerization initiator free from metal salts.

A stabilizer may be added to the water-soluble resin of the present invention, if necessary. Examples of the stabilizer include water-soluble polymers such as polyvinyl alcohol, modified polyvinyl alcohol, polyvinyl pyrrolidone, methacrylic acid polymer, acrylic acid polymer, methacrylic acid-acrylic acid copolymer, ethylene glycol and the like. Furthermore, an anionic surfactant, a non-ionic surfactant, a cationic surfactant and an amphoteric surfactant can be used. The anionic surfactant has an acidic group such as a sulfonic acid group, a carboxylic acid group or the like as a hydrophilic group, but a surfactant is preferably free from metal salts such as Na, K or the like as its counter ion. In general, preferably used are ammonium salts.

The water-soluble resin obtained by polymerizing a vinyl monomer containing an amino group and/or an amide group used in the present invention preferably comprises a copolymer obtained by polymerizing 1 to 100 parts by weight and preferably 50 to 99.5 parts by weight of methacrylamide, and 99 to 0 part by weight and preferably 50 to 0.5 parts by weight of other one or more vinyl monomers.

Such a water-soluble resin can effectively suppress the occurrence of dishing or erosion in CMP or the like, and can exhibit a practical polishing rate.

The weight average molecular weight of the water-soluble resin in the present invention is not particularly limited, but it is preferably from 5,000 to 5,000,000, and more preferably from 10,000 to 500,000. When the weight average molecular weight is less than 5,000, a sufficient polishing rate is not obtained in some cases. When it exceeds 5,000,000, circulation of the slurry solution is worsened and the deviation in performance occurs due to the increase in the viscosity of the slurry in some cases. For this reason, when the weight average molecular weight of the water-soluble resin is within the above range, the productivity is more improved because the balance of the polishing rate and slurry viscosity is excellent.

In the present invention, the content of the water-soluble resin in the polishing composition is not less than 1 wt %, preferably from 1 to 20 wt %, and more preferably from 2 to 20 wt %. When it is less than 1 wt %, it is difficult to obtain an effect of addition such that it is not possible to conduct polishing at a practical polishing rate or the like. On the other hand, when the amount of the water-soluble resin added is not less than 1 wt %, it is possible to conduct polishing at a practical polishing rate, and at the same time it is possible to remarkably suppress the occurrence of scratch, dishing and erosion in CMP or the like.

When the amount of the water-soluble resin used exceeds 20 wt % based on the polishing composition, the viscosity of the polishing composition is increased, and good polishing performance is not obtained in some cases. For this reason, when the amount is within the above numerical range, the above effect can be obtained and at the same time the viscosity of the polishing composition is in the proper range, thus enhancing the workability and polishing performance.

(Abrasive Particles)

In the present invention, in order to effectively improve the polishing rate, organic abrasive particles and/or inorganic abrasive particles may be added.

Examples of the inorganic abrasive particles include inorganic particles such as alumina abrasive particles, silica abrasive particles and the like. However, when the inorganic abrasive particles are excessively added, there is a problem such as scratch or the like. So, the inorganic abrasive particles are preferably added in the required minimum amount in the range capable of achieving the object of the present invention.

Examples of the organic abrasive particles include abrasive particles comprised of organic polymers (organic particles) such as a methacrylic resin, an acrylic resin, a styrene-based resin, a melamine-based resin, a polycarbonate resin and the like. In order not to cause a problem of scratch or the like, organic abrasive particles can be preferably used.

The amount of the organic abrasive particles added is preferably from 1 to 20 wt % and more preferably from 2 to 20 wt % of the polishing composition.

(Water-Soluble Compound Capable of Forming a Complex with a Metal to be Polished)

Examples of the water-soluble compound capable of forming a complex with a metal to be polished include carboxylic acids such as acetic acid, oxalic acid, malic acid, tartaric acid, succinic acid, citric acid and the like; amines such as methylamine, dimethylamine, trimethylamine, ethylamine, diethylamine, triethylamine and the like; amino acids such as glycine, asparatic acid, glutamic acid, cysteine and the like; ketones such as acetylacetone and the like; and nitrogen-containing compounds such as ammonia, urea, imidazole and the like. Of these acids, oxalic acid, malic acid and ethylamine are preferably used.

As the amount of the water-soluble compound added, the optimum amount is different depending on the compound in use, but it is preferably in the range of 0.1 to 10 wt % in the polishing composition. When the amount is less than 0.1 wt %, an effect of addition of the compound cannot be fully exhibited and the intended polishing rate cannot be achieved in some cases. Furthermore, when it exceeds 10 wt %, formation of a complex with a metal to be polished excessively proceeds, and dishing occurs in some cases. Namely, by using the polishing composition in which the amount of the water-soluble compound is within the above range, it is possible to conduct polishing at a practical polishing rate and it is possible to suppress dishing.

(Oxidizing Agent)

As the oxidizing agent used in the present invention, known oxidizing agents can be used, but hydrogen peroxide can be preferably used. The amount of the oxidizing agent used is preferably in the range of 0.1 to 15 wt %, and particularly preferably in the range of 0.5 to 5 wt % in the polishing composition. When the amount is less than 0.1 wt %, chemical reaction between a metal to be polished and the polishing composition does not fully proceed, and the intended polishing rate cannot be achieved in some cases. Further, when the amount exceeds 15 wt %, it becomes difficult to conduct polishing due to passivation of an oxide layer generated on the surface of a metal to be polished, and the intended polishing rate cannot be achieved in some cases.

(Other Additives)

As a polishing accelerator, halogen-containing compounds containing chlorine, fluorine, iodine and the like may be added to the polishing composition of the present invention. Furthermore, in order to protect a region of the metal to be polished where polishing or corrosion is desired to be excluded, nitrogen-containing heterocyclic compounds such as benzotriazole, quinaldic acid or the like may be added as an anti-corrosive agent.

Furthermore, other additives may be added before, during or after the polymerization of the water-soluble polymer to the polishing composition of the present invention. Examples of the additive added in this case include a wetting agent, an anti-static agent, an anti-oxidizing agent, a corrosion preventor, an ultraviolet absorber, a light stabilizer, a fluorescent whitening agent, a coloring agent, a penetrating agent, a foaming agent, a release agent, defoaming agent, a foam regulating agent, a flowability improver, a thickening agent and the like. These additives are preferably free from metal salts.

These additives may be used singly, or two or more additives may be added in combination. The kind thereof and the amount added are not particularly limited as long as the object of the present invention can be achieved.

(Method for Producing Polishing Composition)

A method for producing the polishing composition of the present invention is not particularly limited if the above respective components can be uniformly dispersed in water. For example, the polishing composition can be obtained by adding other additive components and if necessary water to an aqueous solution containing the water-soluble resin obtained by the aqueous polymerization and dispersing the resulting solution using a usual stirrer.

The polishing composition of the present invention is preferably used in the pH range of 5 to 11 and more preferably in the pH range of 7 to 10. When the pH is lower than 5, that is, in an acidic region, elution of a metal to be polished cannot be suppressed so that dishing occurs in some cases. On the other hand, when the pH is higher than 11, that is, in an alkaline region, at the time when a surface of a insulation layer and a surface of metal wiring form the same surface, which is the final point of polishing, the surface of the insulation layer is dissolved or decomposed in some cases. That is, when the pH of the polishing composition is within the above range, it is possible to suppress dishing at the time of polishing, and it is further possible to exactly recognize the final point of polishing.

The substance used for regulating the pH of the polishing composition of the present invention is not particularly limited, but substances free from metal salts are suitably used.

Examples of the alkaline substance include amines such as methylamine, dimethylamine, trimethylamine, ethylamine, diethylamine, triethylamine and the like, and ammonia.

Examples of the acidic substance include inorganic acids such as hydrochloric acid, nitric acid and the like; and organic acids such as acetic acid, oxalic acid, citric acid and the like. These pH regulating agents may be the aforementioned water-soluble compound capable of forming a complex with a metal to be polished. Furthermore, these pH regulating agents may be used singly, or two or more pH regulating agents may be used in combination of 2 or more kinds.

(Polishing Composition)

According to the polishing composition of the present invention, it is possible to polish an excess metal layer on an insulation layer formed wiring pattern in a process for manufacturing semiconductor devices at a practical polishing rate while suppressing the occurrence of scratch, dishing, erosion or the like.

Incidentally, from the viewpoint of effectively improving the polishing rate, organic abrasive particles can be used. In that case, the polishing composition of the present invention may contain:

a water-soluble resin of not less than 1 wt % or from 1 to 20 wt % and preferably from 2 to 20 wt %;

organic abrasive particles of from 1 to 20 wt % and preferably from 2 to 20 wt %;

a water-soluble compound capable of forming a complex with a metal to be polished of from 0.1 to 10 wt % and preferably from 0.5 to 5 parts by weight; and an oxidizing agent of from 0.1 to 15 wt % and preferably from 0.5 to 5 wt %. Incidentally, combination of these numerical ranges can be properly selected.

According to this, it is possible to conduct polishing of a metal layer on an insulation layer formed wiring pattern in a process for manufacturing semiconductor devices at a practical polishing rate while effectively suppressing the occurrence of scratch, dishing, erosion or the like.

Meanwhile, when organic abrasive particles are contained in the polishing composition of the present invention, the polishing composition of the present invention may contain:

a water-soluble resin in an amount of from 2.2 to 94.3 wt % and preferably from 6.3 to 87.0 wt %;

organic abrasive particles in an amount of from 2.2 to 94.3 wt % and preferably from 6.3 to 87.0 wt %;

a water-soluble compound capable of forming a complex with a metal to be polished in an amount of from 0.2 to 82.6 wt % and preferably from 1.1 to 52.6 wt %; and an oxidizing agent in an amount of from 0.2 to 87.7 wt % and preferably from 1.1 to 52.6 wt %, based on 100 wt % of the solid content of the polishing composition. Incidentally, combination of these numerical ranges can be properly selected.

The polishing composition in such a composition ratio is particularly excellent in the above effect.

EXAMPLES

The present invention is now illustrated in detail below with reference to Examples. However, the present invention is not restricted to these Examples. Incidentally, "part(s)" in the following Examples indicates part(s) by weight.

The polishing composition was evaluated in the following manner.

(Substance to be Polished)

The following "substance to be polished 1" was used for the evaluation of the polishing rate, while the following "substance to be polished 2" was used for the evaluation of the amount of dishing and erosion.

Substance to be polished 1: 5,000 Å of a thermal silicon oxide layer, 300 Å of a Ta layer formed by the sputtering method, 1,500 Å of a seed copper layer for plating formed by the CVD method and 15,000 Å of a copper layer formed by the plating method are stacked on the 8-inch silicon wafer.

Substance to be polished 2: A silicon wafer with wiring pattern formed thereon (product name: SEMATECH#854).

(Polishing Rate)

The polishing rate of the above substance to be polished 1 was evaluated under the following conditions, employing the apparatus and the like.

Polishing slurry: Polishing compositions obtained in Examples 1 to 5 and Comparative Examples 1 to 3.
Polishing apparatus: Lapmaster LGD-15
Polishing pad: 340 mm IC-1000/suba 400, XY-groove
Polishing load: 3.3 psi
Polishing time: 1 min.
Polishing slurry supply rate: 15 ml/min.
Table rotation speed: 45 rpm
Rotation speed on the side of substrate: 45 rpm
Calculation of polishing rate: The substance to be polished 1 was subjected to an ultra pure water rinse and ultrasonic cleaning, and then dried. A layer thickness was measured by measuring the sheet resistance using a 4-point probe. An average polishing rate was calculated from the change in the layer thickness before and after polishing and the polishing time.

(Amount of Dishing)

The substance to be polished 2 was polished under the conditions and employing the apparatus used for the evaluation of the polishing rate. In order to evaluate the amount of dishing, it was polished over the polishing time which was 1.1 times of the usual time required until polishing of a copper in the area having no groove was completed. After polishing, in the area where a range of a wiring width is 10 μm, a layer thickness of a concave formed in the center of a copper wiring groove was measured by using a stylus profilometer (a product of ULVAC, Inc., DEKTAK3030).

(Evaluation of Erosion)

In the area where a range of a wiring width is 10 μm and a range of a wiring width is 100 μm of the substance to be polished 2 used for the evaluation of the amount of dishing, its cross sectional shape was observed using SEM. A barrier layer and an insulation layer were observed whether erosion occurred or not due to excessive polishing thereof. As a result, ○ indicated a case where a Ta layer or a thermal silicon oxide layer was not damaged, while x indicated a case where a Ta layer or a thermal silicon oxide layer was damaged.

Production Example 1

Into a flask equipped with a dropping funnel, a stirrer, a thermometer and a reflux condenser was charged 400 parts by weight of distilled water (hereinafter, simply referred to as part(s)). The distilled water was heated to 70 degree centigrade while stirring and replacing the atmosphere with nitrogen. While the temperature was kept at 70 degree centigrade, 2.0 parts of ammonium persulfate was added thereto as a polymerization initiator. Then, a mixed aqueous solution comprised of 500 parts of distilled water, 85 parts of methacrylamide, 10 parts of methacrylic acid and 5 parts of ethyl acrylate was added dropwise into the flask over 3 hours. After dropwise addition, the reaction solution was further continuously stirred at the same temperature for 4 hours for the completion of the polymerization reaction to obtain a water-soluble resin having a weight average molecular weight of 38,000.

Production Example 2

A water-soluble resin having a weight average molecular weight of 52,000 was obtained in the same manner as in Production Example 1, except that 99 parts of dimethylaminoethyl methacrylate and 1 part of acrylic acid were used instead of 85 parts of methacrylamide, 10 parts of methacrylic acid and 5 parts of ethyl acrylate.

Production Example 3

A water-soluble resin having a weight average molecular weight of 83,000 was obtained in the same manner as in Production Example 1, except that 80 parts of dimethylaminopropylacrylamide and 20 parts of 2-hydroxyethyl methacrylate were used instead of 85 parts of methacrylamide, 10 parts of methacrylic acid and 5 parts of ethyl acrylate, and 2,2'-azobis[2-methyl-N-(2-hydroxyethyl)propionamide] was used instead of ammonium persulfate.

Production Example 4

A water-soluble resin having a weight average molecular weight of 47,000 was obtained in the same manner as in Production Example 1, except that the amount of ammonium persulfate added was changed to 1.5 parts, and 85 parts of methacrylic acid and 15 parts of 2-hydroxyethyl methacrylate were used instead of 85 parts of methacrylamide, 10 parts of methacrylic acid and 5 parts of ethyl acrylate.

Example 1

The water-soluble resin produced in Production Example 1, oxalic acid, aqueous hydrogen peroxide solution, ammonia, benzotriazole and pure water were well mixed. A polishing composition was produced such that the concentration of the solid content of the water-soluble resin was 5.0%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

Example 2

The water-soluble resin produced in Production Example 1, organic abrasive particles comprised of a styrene-methacrylic acid copolymer, oxalic acid, aqueous hydrogen peroxide solution, ammonia, benzotriazole and pure water were well mixed. A polishing composition was produced such that the concentration of the solid content of the water-soluble resin was 2.5%, the concentration of the solid content of organic abrasive particles was 2.5%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

Example 3

The water-soluble resin produced in Production Example 1, organic abrasive particles comprised of a methyl methacrylate-methacrylic acid copolymer, oxalic acid, aqueous hydrogen peroxide solution, ammonia, benzotriazole and pure water were well mixed. A polishing composition was produced such that the concentration of the solid content of the water-soluble resin was 1.3%, the concentration of the solid content of organic abrasive particles was 3.7%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

Example 4

The water-soluble resin produced in Production Example 2, organic abrasive particles comprised of a styrene-methacrylic acid copolymer, oxalic acid, aqueous hydrogen peroxide solution, ammonia, benzotriazole and pure water were well mixed. A polishing composition was produced such that the concentration of the solid content of the water-soluble resin was 2.5%, the concentration of the solid content of organic abrasive particles was 2.5%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

Example 5

The water-soluble resin produced in Production Example 3, organic abrasive particles comprised of a butyl acrylate-methacrylic acid copolymer, oxalic acid, aqueous hydrogen peroxide solution, ammonia, benzotriazole and pure water were well mixed. A polishing composition was produced such that the concentration of the solid content of the water-soluble resin was 2.5%, the concentration of the solid content of organic abrasive particles was 2.5%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

Comparative Example 1

The water-soluble resin produced in Production Example 4, oxalic acid, aqueous hydrogen peroxide solution, ammonia, benzotriazole and pure water were well mixed. A polishing composition was produced such that the concentration of the solid content of the water-soluble resin was 5.0%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

Comparative Example 2

Polyvinyl alcohol (product name: PVA117, a product of Kuraray Co., Ltd.) as a water-soluble resin, oxalic acid, aqueous hydrogen peroxide solution, ammonia, benzotriazole and pure water were well mixed. A polishing composition was produced such that the concentration of the solid content of the polyvinyl alcohol was 5.0%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

Comparative Example 3

The water-soluble resin produced in Production Example 1, oxalic acid, aqueous hydrogen peroxide solution, ammonia, benzotriazole and pure water were well mixed. A polishing composition was produced such that the concentration of the solid content of the water-soluble resin was 0.8%, the concentration of hydrogen peroxide was 2.0%, the concentration of oxalic acid was 1.0%, the concentration of benzotriazole was 0.018%, and the pH was 7.2. Using this polishing composition, the polishing rate, the amount of dishing and erosion were evaluated. The results are shown in Table 1.

TABLE 1

| | Polishing rate [Å/min.] | Amount of dishing [Å] | Erosion |
|---|---|---|---|
| Example 1 | 2700 | 900 | O |
| Example 2 | 3300 | 500 | O |
| Example 3 | 1800 | 1050 | O |
| Example 4 | 2200 | 1700 | O |
| Example 5 | 1180 | 1500 | O |
| Comparative Example 1 | 5300 | 3200 | O |
| Comparative Example 2 | 520 | 2800 | O |
| Comparative Example 3 | 670 | 1100 | O |

INDUSTRIAL APPLICABILITY

By using the polishing composition of the present invention, it is possible to provide a polishing composition having a practical polishing rate while erosion is not generated and the amount of dishing is suppressed to low.

The invention claimed is:

1. A polishing composition containing a water-soluble resin,
wherein said water-soluble resin comprises a copolymer obtained by polymerizing a methacrylamide and a vinyl monomer having at least one carboxyl group,
wherein said water-soluble resin has a weight average molecular weight of 5,000 to 5,000,000, and
wherein said water-soluble resin is contained in an amount of not less than 1 wt %, based on the total weight of the polishing composition.

2. The polishing composition as set forth in claim 1, wherein said copolymer is obtained by polymerizing 1 to 100 parts by weight of said methacrylamide and 99 to 0 part by weight of the vinyl monomer having at least one carboxyl group.

3. The polishing composition as set forth in claim 1, wherein the pH is from 5 to 11.

4. The polishing composition as set forth in claim 3, further containing organic particles and/or inorganic particles and water.

5. The polishing composition as set forth in claim 3, further containing a water-soluble compound capable of forming a complex with a metal to be polished and water.

6. The polishing composition as set forth in claim 5, wherein said water-soluble compound capable of forming a complex with a metal to be polished is at least one kind selected from carboxylic acids, amines, amino acids ketones and nitrogen-containing compounds.

7. The polishing composition as set forth in claim 6, wherein said water-soluble compound capable of forming a complex with a metal to be polished is an oxalic acid.

8. The polishing composition as set forth in claim 3, further containing an anti-corrosive agent.

9. The polishing composition as set forth in claim 8, wherein said anti-corrosive agent is a benzotriazole.

10. The polishing composition as set forth in claim 3, further containing an oxidizing agent.

11. The polishing composition as set forth in claim 10, wherein said oxidizing agent is a hydrogen peroxide.

* * * * *